United States Patent [19]

Divakaruni et al.

[11] Patent Number: 5,463,335
[45] Date of Patent: Oct. 31, 1995

[54] POWER UP DETECTION CIRCUITS

[75] Inventors: Sridhar Divakaruni, South Burlington; Jeffrey H. Dreibelbis, Williston; Wayne F. Ellis; Anatol Furman, both of Jericho; Howard L. Kalter, Colchester, all of Vt.

[73] Assignee: International Business Machines Corporation, Armonk, N.Y.

[21] Appl. No.: 969,594

[22] Filed: Oct. 30, 1992

[51] Int. Cl.⁶ .................................................. H03K 17/22
[52] U.S. Cl. ........................................ 327/143; 327/206
[58] Field of Search .......................... 327/78, 143, 205, 327/206

[56] References Cited

U.S. PATENT DOCUMENTS

| | | | |
|---|---|---|---|
| 4,196,362 | 4/1980 | Maehashi | 327/77 |
| 4,300,065 | 11/1981 | Remedi et al. | 327/436 |
| 4,581,552 | 4/1986 | Womack et al. | 327/142 |
| 4,591,745 | 5/1986 | Shen | 327/143 |
| 4,634,904 | 1/1987 | Wong | 327/143 |
| 4,818,904 | 4/1989 | Kobayashi | 327/143 |
| 4,902,907 | 2/1990 | Haga et al. | 327/143 |
| 4,902,910 | 2/1990 | Hsieh | 327/143 |
| 4,983,857 | 1/1991 | Steele | 327/143 |
| 5,030,845 | 7/1991 | Love et al. | 327/143 |

FOREIGN PATENT DOCUMENTS

0150480  8/1985  European Pat. Off. .

*Primary Examiner*—Willis R. Wolfe
*Attorney, Agent, or Firm*—Stephen J. Limanek

[57] ABSTRACT

A power up detection circuit is provided which includes a power supply terminal, an output terminal, an impedance device coupling the output terminal to the power supply terminal and a latch including a first inverter having a first device connected between the output terminal and a point of reference potential and a second device connected between the output terminal and the power supply terminal, the devices are designed so that subthreshold current passing through the first device is greater than the effective subthreshold current passing through the impedance device and the second device, and a second inverter including third and fourth devices which are designed so that a smaller subthreshold current passes through the third device than the subthreshold current passing through the fourth device. The power up circuit may further include a capacitor connected between the power supply terminal and gate electrodes of the first and second devices.

20 Claims, 5 Drawing Sheets

POWER UP DETECTION CIRCUITS

TECHNICAL FIELD

This invention relates to power up detection circuits, which are also known as power on reset circuits, for reliable high density integrated circuit operation.

BACKGROUND ART

Due to the growing complexity of integrated circuits on semiconductor substrates or chips and the asynchronous nature of power source and clock inputs, when a system on a chip is powered up, reliable power on reset circuits are becoming of critical importance in integrated circuit technology. A reliable power on reset pulse greatly simplifies and improves the reliability of circuit designs for, e.g., enabling redundancy, maintaining off chip drivers in a tri-state condition during power up and controlling clock logic so that the integrated circuit does not power up into an undesirable mode.

In most previously designed integrated circuits, power on reset circuits were not required because it was assumed that the circuit or system would control clock inputs during the power on state, there were fewer components on a circuit card and, therefore, even when clock inputs were uncontrolled, off chip driver circuit contention on data buses was not a significant problem and redundant circuits were simpler, merely using a NOR circuit of n fuses in series with n pull down field effect transistors.

As the level of integration on a chip increases, the need for reliable power on reset circuits increases since the sophisticated power on control logic available with larger systems such as main-frames and mid-frames is no longer available in low-ended systems, e.g., personal computer systems and workstations. Also, newer technologies have led to the capability of packing a far larger number of integrated circuits on cards, wherein off chip driver circuit contention on data buses can abort a power on sequence due to current overload, redundant circuits are becoming more sophisticated and often more numerous for optimal area and performance of circuits, and on chip clock logic is getting more sophisticated due to the need for handling new functions that are invoked during specific permutations of logic signals, such as for test mode entry. Accordingly, integrated circuit semiconductor chips employing advanced technology are more prone to powering up into a false state when not provided with a reliable power on reset circuit.

A number of power up detection or power on reset circuits have been proposed, such as in U.S. pat. No. 4,300,065, by J. J. Remedi et al, issued on Nov. 10, 1981, disclosing a power on reset circuit including a threshold detector which provides an output when the power supply voltage exceeds a transistor threshold voltage by approximately half a volt and a capacitor connected to the positive power supply terminal for widening the output pulse when the power supply rises at a slow rate. U.S. Pat. No. 4,591,745, by S. N. Shen, issued May 27, 1986, discloses a power-on reset pulse generator which includes an R-C network and a latch. Also, U.S. Pat. No. 4,902,907, by A. Haga et al, issued on Feb. 20, 1990, teaches a reset signal generating circuit which includes a first switch controlled by a divided voltage from a voltage dividing circuit turned on when the power source voltage rises to a value in the vicinity of a predetermined value with an arbitrary rising speed and a second switch turned on by the first switch and connected to a capacitor for charging and discharging the capacitor to provide a reset signal. Furthermore, U.S. Pat. No. 4,983,857, by R. C. Steele, issued on Jan. 8, 1991, discloses a power-up reset circuit which includes first and second serially connected field effect transistors disposed between a power supply voltage and an input of an inverter, a capacitor connected between the input of the inverter and the low supply voltage, with current flowing through the field effect transistors to charge the capacitor only when the supply voltage is greater than the sum of the absolute values of their threshold voltages and a depletion mode transistor shunting to ground any subthreshold leakage through the first and second transistors. Additionally, U.S. Pat. No. 5,030,845, by A. M. Love et al, issued Jul. 9, 1991, discloses a power-up pulse generator circuit in which channel width-to-length ratios of transistors are used to control a subthreshold current during the initial part of the power-up transient.

Prior art for power up detect circuits generally features components connected to an effective RC delay circuit. The delayed mode is then compared to, e.g., the power supply to determine that sufficient voltage has been applied to the integrated circuit chip for proper circuit operation. This type of power up detect circuit may operate satisfactorily in applications where power supply ramp rates are relatively fast, such as in circuit testers and personal computers, but it becomes less reliable in larger systems where ramp rates are several hundred milli-seconds. Effective power up detect circuits must be able to function reliably in systems having very fast to very slow power supply ramp rates.

DISCLOSURE OF THE INVENTION

It is an object of this invention to provide improved automatic power on reset circuits for integrated circuits which utilize subthreshold currents to provide for reliable detection of sufficient power supply voltage during ramp up for a wide range of voltage rise times.

In accordance with the teachings of this invention, a power on reset circuit is provided which includes an output terminal connected through an impedance to a power supply, with the output being further connected through a subthreshold leakage device of a latch to a point of reference potential, the subthreshold leakage device being switched from an initial subthreshold mode to a conduction mode in response to a predetermined level of output voltage developed on the output terminal.

The foregoing and other objects, features and advantages of this invention will be apparent from the following more particular description of the preferred embodiments of the invention, as illustrated in the accompanying drawings.

BEST MODE FOR CARRYING OUT THE INVENTION

Figure 1:
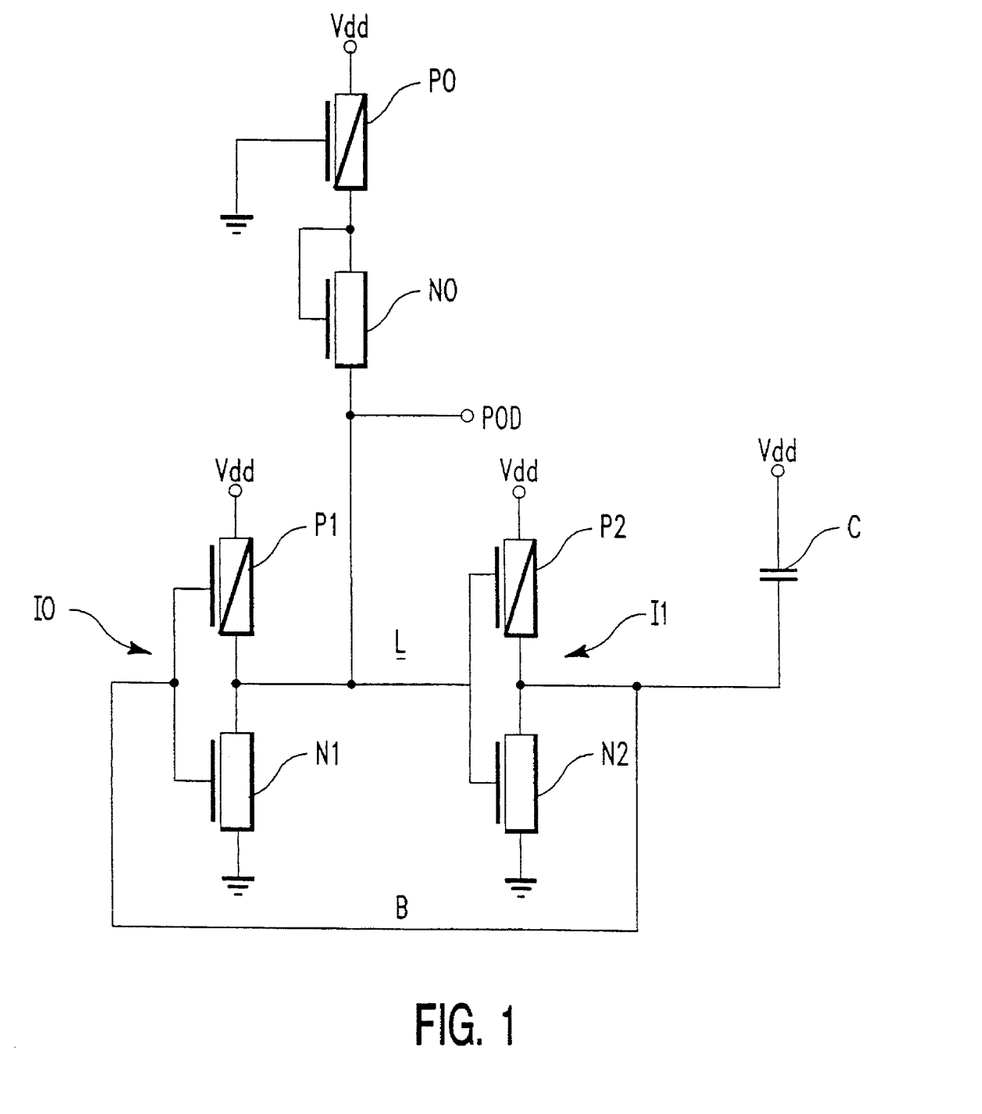
FIG. 1 is a circuit diagram of the reset circuit in accordance with the teachings of the present invention.

Referring to the drawings in more detail, there is illustrated in FIG. 1 a circuit diagram of one embodiment of the power up detection or reset circuit of the present invention which is made on a semiconductor substrate or integrated circuit chip preferably in the complementary metal oxide semiconductor, CMOS, technology. The circuit of FIG. 1 of the drawings includes a first P-channel field effect transistor P0 and a serially connected first N-channel field effect transistor N0 connected between a power supply Vdd of, e.g., 3.6 volts, and a power on detect output terminal POD, with the drain electrodes of the transistors P0 and N0 being interconnected at a common point and a gate electrode of the transistor N0 being connected to the common point and the gate electrode of the transistor P0 being connected to a point of reference potential such as ground. Such a connection insures that noise on the power supply Vdd during power up does not couple to the output terminal POD. A latch L has a first inverter I0 and a second inverter I1, with the first inverter I0 having a second P-channel field effect transistor P1 and a serially connected N-channel field effect transistor N1 disposed between the power supply Vdd and the point of reference potential or ground and the second inverter I1 having a third P-channel field effect transistor P2 and a serially connected N-channel field effect transistor N2 also disposed between the power supply Vdd and ground. Drain electrodes of the second P-channel and second N-channel transistors P1 and N1 are connected to the output terminal POD and gate electrodes of each of the third P-channel and third N-channel transistors P2 and N2 are connected to the output terminal POD, with the drains of the third P-channel and third N-channel transistors P2 and N2 being connected to each of the gate electrodes of the second P-channel and second N-channel transistors P1 and N1. A linear non-voltage dependent capacitor C is connected between the power supply Vdd and the drains of the third P-channel and third N-channel transistors P2 and N2.

In the operation of the embodiment of the circuit of the present invention illustrated in FIG. 1 of the drawings, to reliably detect very slow ramp rates, the physical property of field effect transistors controlling the subthreshold current is used. This subthreshold current occurs in what is normally called the OFF state of the field effect transistor, i.e., prior to the time that the transistor has its threshold voltage applied to its gate electrode. Typically, the subthreshold current has a value in the 1 picoampere to the 100 nanoampere range. A characteristic of the subthreshold current is that it varies with the transistor or device length in short devices, however, this variability decreases for long devices. Therefore, by utilizing subthreshold currents of various length devices connected in the latch L, as illustrated in FIG. 1 of the drawings, the sensitivity to slow power supply ramp rates is eliminated. The charging of latch nodes is controlled by device subthreshold current and the latch state threshold voltage is determined largely by the device widths of P0 and N0. The use of the latch L is very significant in that it provides a rapid change of state during slow power supply ramp up in order to avoid oscillations in the circuit it is intended to initialize. Slow state transitions affect logic circuits in much the same manner as indeterminate input levels.

An example of desirable dimensions in micrometers of the width to length ratio, w/l, for the transistors of FIG. 1 is as follows: P0 is 20/0.80, N0 is 20/0.70, P1 is 4.5/1.0, N1 is 1.0/0.65, P2 is 4.5/0.75 and N2 is 1.5/0.9. For fast power supply ramp rates, the capacitor C in FIG. 1 (having a value of e.g. 0.35 picofarads) is added, preferably by utilizing the gate-to-source and gate-to-drain overlap capacitances of the PFET.

Figure 2:
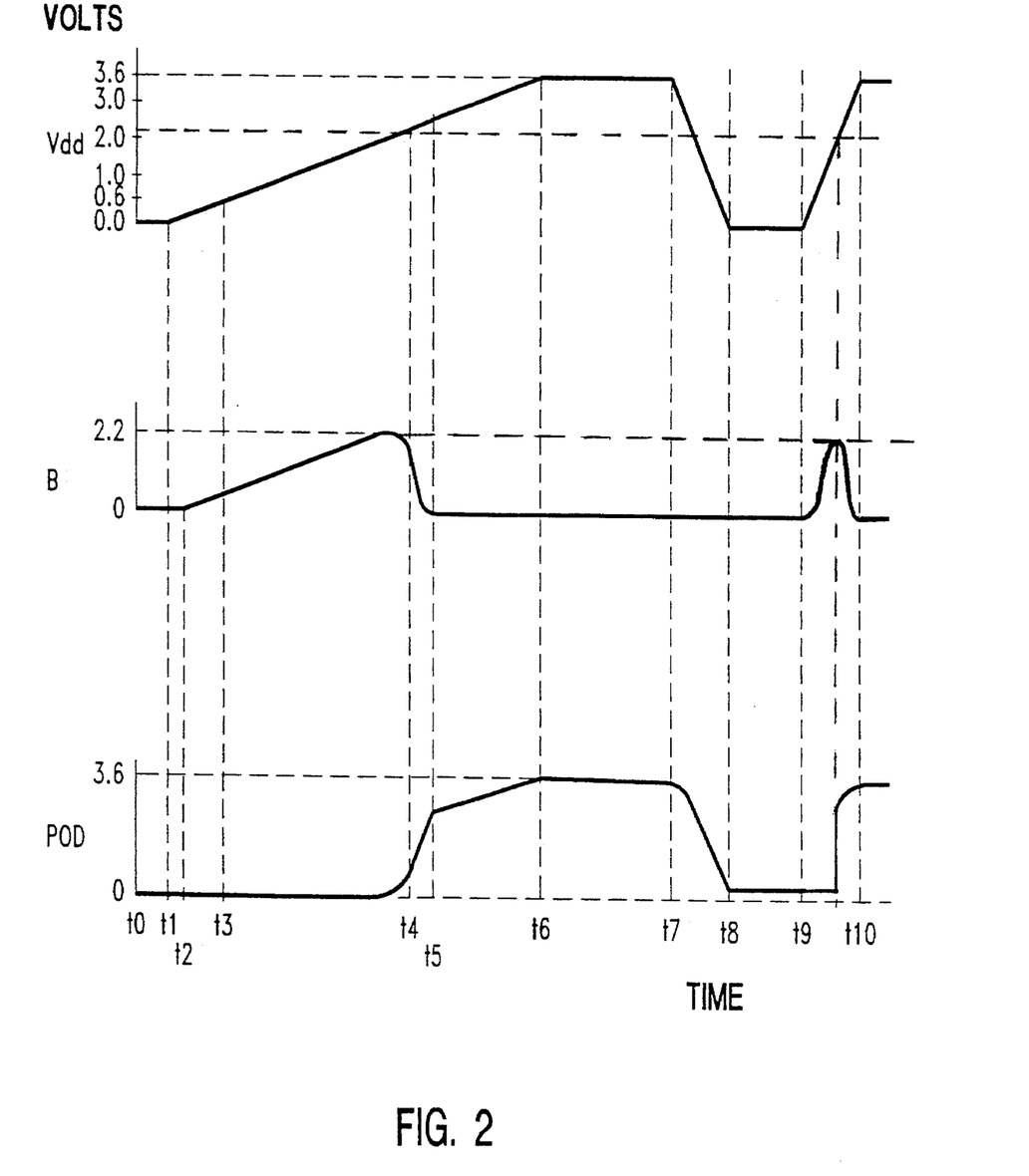
FIG. 2 is a graph indicating the voltages at various nodes in the circuit of FIG. 1 of the drawings plotted against time.
Figure 3:
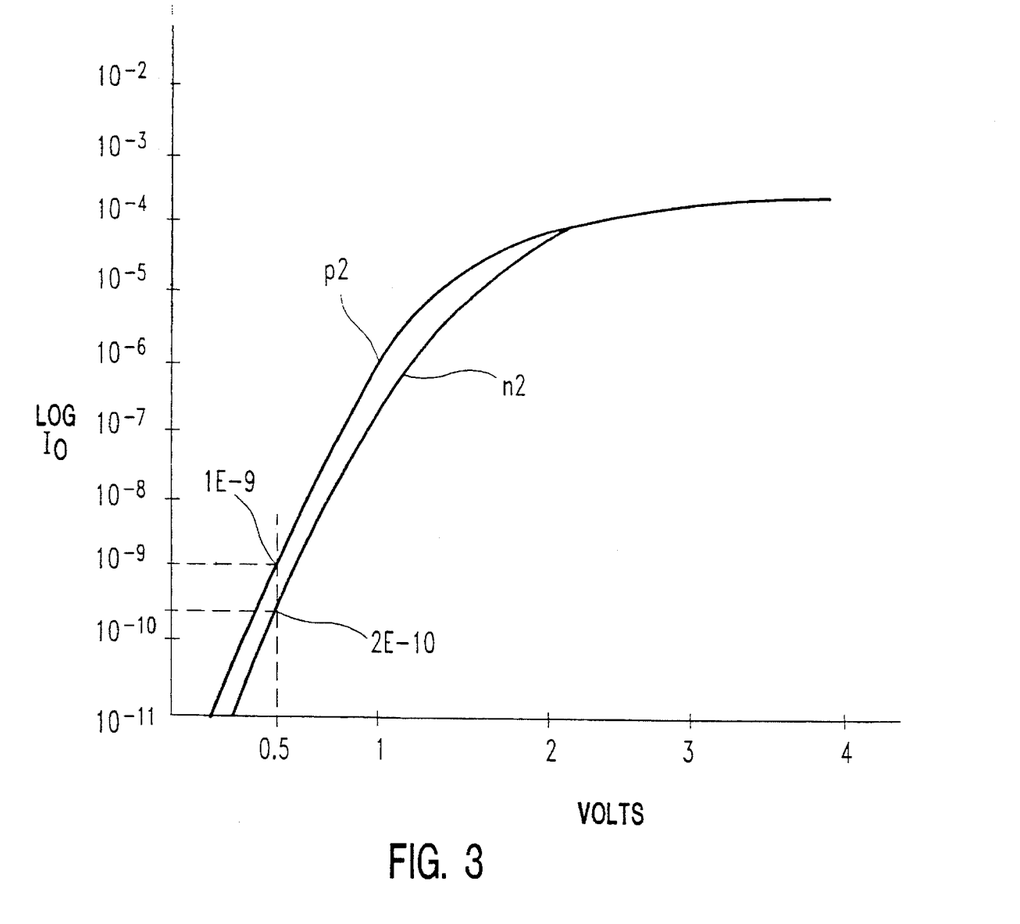
FIG. 3 is a graph plotted on a log scale indicating the current passing through field effect transistors of latch-oriented inverter circuits of FIG. 1 of the drawings during an early stage of the power up of a power supply voltage source.

The operation of the power up detection circuit of FIG. 1 can be better understood by referring to the graphs shown in FIGS. 2 and 3. During a slow ramp rate power up, each of the nodes POD, B and Vdd is at zero volts at time t0, as indicated in the graph of FIG. 2 of the drawings, with the voltage at the terminal Vdd of the power supply beginning to rise at time t1. As the voltage at the terminal Vdd begins to rise, subthreshold currents, which may be from 1 to 100 picoamperes, begin to pass through the transistors P0, N0, P1, N1, P2 and N2. At time t2, shortly after time t1, the subthreshold current passing through P-channel transistor P2 of the second inverter I1 charges node B to approximately the same voltage as Vdd, consequently, the capacitor C is not electrically active since the voltages on both plates of the capacitor rise at substantially the same rate. The rise in voltage of node B toward Vdd is due to the dimensions of the transistors P0, N0, P1, N1, P2 and N2, with the subthreshold current passing through the drain of the third P-channel transistor P2 being much greater than the subthreshold current passing through the drain of the third N-channel transistor N2. This difference in subthreshold current may be seen more clearly by referring to the graph of FIG. 3 of the drawings wherein the voltage Vdd in volts is plotted against the log of the subthreshold drain current $I_o$ in the third P-channel transistor P2 indicated at curve p2 and in the third N-channel transistor N2 indicated at curve n2. It can be seen that when the voltage at Vdd is 0.5 volts, the subthreshold current through the transistor P2 is about $10^{-9}$ or 1E-9 amperes, whereas the subthreshold current through the transistor N2 is only 2E-10 amperes. This difference in subthreshold currents tends to charge up node B and turn on the second N-channel transistor N1 which clamps the output terminal or node POD to ground. The dimensions of the second N-channel transistor N1 are such that the subthreshold current passing through its drain is much greater than the effective subthreshold current passing through the serially arranged first P-channel transistor P0 and first N-channel transistor N0 and through the drain of the second P-channel transistor P1. Thus, it can be seen that the initial state of the latch L has been set by the subthreshold currents.

As the voltages at the supply terminal Vdd and at the node B continue to rise above the threshold voltage $V_{TN}$, $V_{TP}$ of, e.g., 0.6 volt, at time t3, as indicated in FIG. 2 of the drawings, the transistors N1 and P2 of the latch L pass from the subthreshold conduction mode to the conduction or ON state. In contrast, transistors P1 and N2 are still in the subthreshold mode at this time. Although the first P-channel transistor P0 and the first N-channel transistor N0 are beginning to conduct, the output terminal POD is still clamped to ground by the second N-channel transistor N1 being ON. As the voltages at the supply terminal Vdd and at the node B continue to rise toward approximately two volts, the first P-channel transistor P0 is in the on state, and the first N-channel transistor N0 now passes from the subthreshold conduction mode to the ON state and supplies sufficient current to the output terminal POD that the second N-channel transistor N1 can no longer maintain the output terminal POD at ground. As the output terminal POD charges up, the overdrive on the third P-channel transistor P2 decreases and the third N-channel transistor N2 begins to turn on, discharging node B, as indicated in the graph of FIG. 2 at time t4. While the voltage on node B drops, the overdrive on the second N-channel transistor N1 is reduced allowing the voltage at the output terminal POD to rise further. As the voltage at node B falls to ground, turning the second P-channel transistor P1 on and the second N-channel transistor N1 off, the latch L rapidly changes state at approximately time t5, as indicated in the graph of FIG. 2 of the drawings. The second P-channel transistor P1 then continues to charge the output terminal POD toward a full Vdd voltage at time t6 while the third N-channel transistor N2 holds node B at ground, which insures the elimination of DC currents that could result if the circuit nodes were not fully charged or discharged to the terminal voltages of the power supply. The beta or width/length ratios of the latch L transistors P1, N1, P2 and N2 in relation to the first P-channel transistor P0 and first N-channel transistor N0 are defined such that the detected value of the voltage at the terminal Vdd is high enough to insure proper on chip logic circuit initialization for variable process parameters and temperatures.

For fast voltage ramp rates, the supply voltage Vdd rises faster than the voltage at the node B, thus, the capacitor C is now electrically active in the circuit. During the fast Vdd voltage ramp rates, local coupling through overlap capacitances can produce noise signals that could interfere with the latch operation when the latch L is being controlled initially by the subthreshold currents. For this situation, the capacitor C is used to insure that the voltage at node B continues to rise until the transistors P1, N1, P2 and N2 of the latch L are in the ON state. At this point, the second N-channel transistor N1 and the third P-channel transistor P2 control the voltage at the output terminal POD and at the node B as for the slow voltage ramp rate. Also, the first P-channel transistor P0 and the first N-channel transistor N0 effect the changing of the state of the latch L at the appropriate value of the power supply voltage as indicated hereinabove in connection with the discussion of the operation of the circuit during the slow voltage ramp rate.

In another aspect of the present invention, this power up detection circuit may be used during a hot plug operation, i.e., during a fast voltage ramp down followed shortly thereafter with a ramp up, which occurs when a component or component card is plugged or unplugged while system power is still on. Although this practice is discouraged by system and component manufacturers, a power up detect circuit should operate properly for such an inadvertent occurrence. As stated hereinabove, a hot plug incident appears as a rapid ramp down followed by a ramp up of the Vdd voltage. During rapid ramp down, the voltage at the output terminal POD is at a full Vdd or 3.6 volts and the node B is at ground, as indicated in the graph of FIG. 2 at time t7. As the voltage at terminal Vdd falls, the voltage at the output terminal POD is discharged through the second P-channel transistor P1 to approximately 0.2 volts in about 50 nanoseconds. Due to the capacitor C, the voltage at node B is maintained between 0 and −0.5 volts which insures that the voltage at the output terminal POD reaches a low enough value at time t8 for a fast ramp up to proceed properly at time t9 of FIG. 2. The time for the fast ramp up is approximately 50 nanoseconds with the time between the completion of the fast ramp down at time t8 and the beginning of the fast ramp up at time t9 being approximately 50 nanoseconds. At time t10 both the supply voltage Vdd and the output terminal voltage POD are at full power supply voltage of 3.6 volts.

Figure 4:
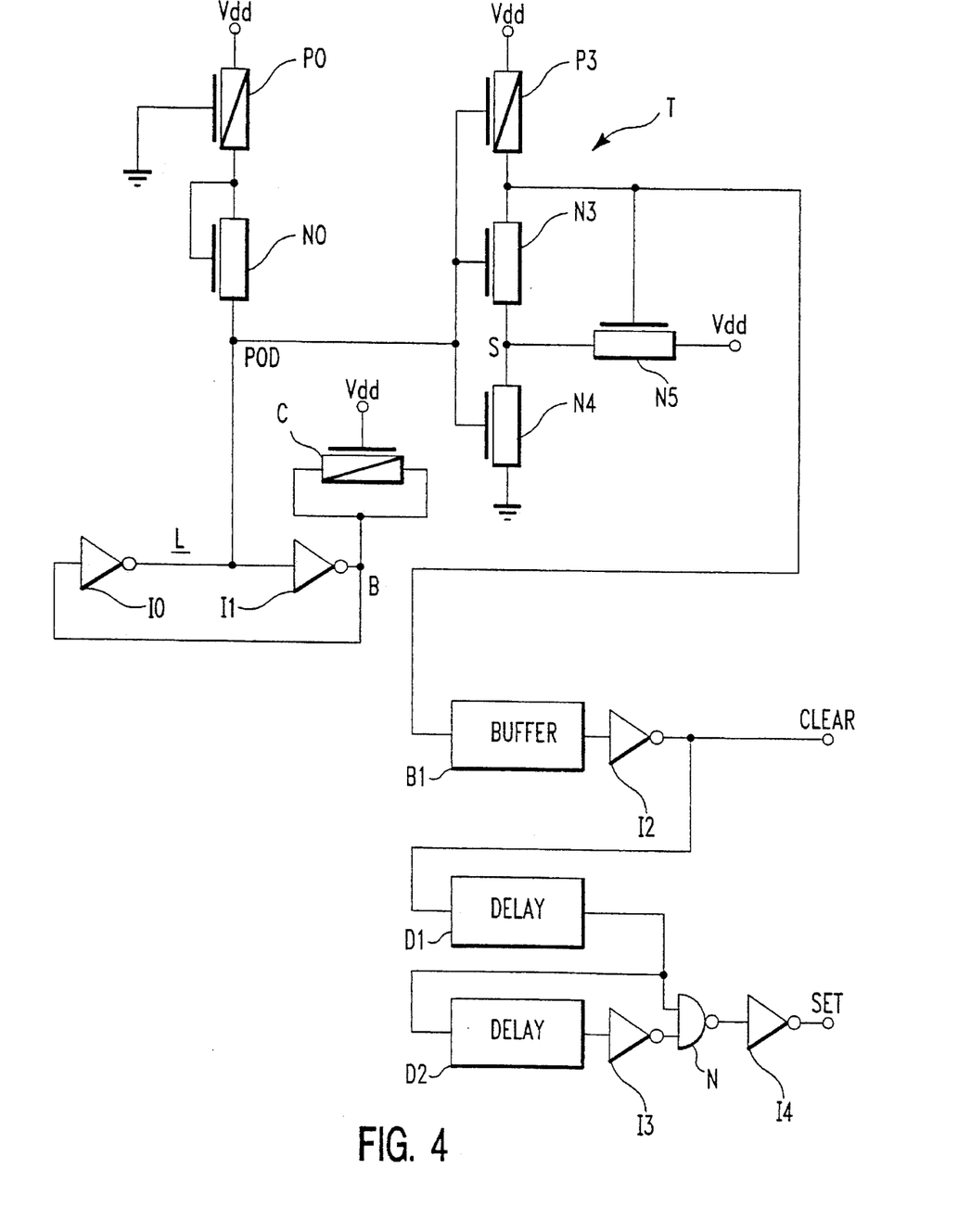
FIG. 4 is a circuit diagram, partly in block form, illustrating the reset circuit of the present invention when used to provide various desired and reliable output pulses even at very low ramp speeds.

FIG. 4 is a circuit diagram, partly in block form, illustrating the power up detection circuit of the present invention when used to provide various desired and reliable output pulses even at very slow ramp speeds. The circuit of FIG. 4 is in part similar to that of the circuit of FIG. 1 but with the addition of a Schmitt trigger circuit T connected to the output terminal POD and with a delayed one-shot pulse circuit coupled to the output of the Schmitt trigger circuit T to provide pulses which may be used, e.g., as CLEAR and SET signals on a semiconductor chip. The N-channel field effect transistors of the Schmitt trigger circuit T are sized such that the input detect voltage level is greater than the threshold voltage $V_{TN}$ of the transistors N3 or N4, which insures that the input voltage to a buffer circuit B1 at the output of circuit T is free of noise or indeterminate states due to slow transitions.

The Schmitt trigger circuit includes a fourth P-channel field effect transistor P3, connected between the power supply Vdd and an input of the buffer circuit B1, which may be made of inverters, and fourth, fifth and sixth N-channel field effect transistors N3, N4 and N5, respectively. The fourth N-channel transistor N3 is connected between the input of the buffer circuit B1 and the fifth N-channel transistor N4, the fifth N-channel transistor N4 being connected between the fourth N-channel transistor N3 and ground, and the sixth N-channel transistor N5 is connected between the power supply terminal Vdd and the common point S between the fourth and fifth N-channel transistors N3 and N4, respectively. The gate electrodes of each of the transistors P3, N3 and N4 are connected to the output terminal POD, with the gate electrode of the sixth N-channel transistor N5 being connected to the input of the buffer circuit B1.

The output of the buffer circuit B1 is connected to an input of a third inverter I2. The output of the third inverter I2 is connected to a CLEAR terminal and to an input of a first delay circuit D1 and the output of the first delay circuit D1 is connected to an input of a second delay circuit D2 and to a first input of a NAND circuit N. An output of the second delay circuit D2 is connected to a second input of the NAND circuit N through a fourth inverter I3 and the output of the NAND circuit N is connected to a SET terminal through a fifth inverter I4, preferably an amplifying inverter.

In the operation of the circuit of the present invention shown in FIG. 4, the power on detect portion having transistors P0 and N0, inverters I0 and I1 and the capacitor C, as also illustrated in FIG. 1 of the drawings, maintains the voltage at the output terminal POD substantially equal to the reference potential, ground, during the early stages of power up. The proper design of the transistor w/l ratios for subthreshold current optimization insures that the latch L and, therefore, the output terminal POD assume the correct low initial voltage level. When the voltage at the power supply Vdd reaches a level predetermined by the w/l ratios of the transistors P0 and N0 to the w/l ratios of the transistors of the inverters I0 and I1, the voltage at the output terminal POD begins to rise. At this point in time the gain of the latch L formed by the inverters I0 and I1 provides a rapid change of state from the voltage at the output terminal POD being substantially equal to ground to being charged to the full supply voltage Vdd.

The speed of state transition facilitated by the gain of the latch L, in conjunction with a Schmitt trigger circuit T insures a noise free, rapid transition at the input of the buffer B1. It can be seen that as the Schmitt trigger circuit input from the output terminal POD rises, transistors N3 and N4 begin to turn on. However, transistor N5 maintains node S clamped at a voltage Vdd minus the threshold voltage of the transistor N5. The channel length of the transistor N5 is designed to be shorter than the length of transistors N3 and N4 so that transistor N5 has a slightly lower threshold voltage. The w/l ratios of the transistors N3 and N4 are designed smaller than that of the transistor P3, resulting in the Schmitt trigger detect level being higher than the threshold voltage of the N-channel transistor N5, and, thus, will track correctly with process parametric variations. Therefore, when the voltage at the output terminal POD rises above the trigger detect level, the transistors N3 and N4 overpower transistor P3, causing the transistor N5 to turn off as voltage applied to the input of the buffer B1 falls. Accordingly, this circuit arrangement results in the CLEAR and SET outputs functioning as accurate logic signals with rapid state transition, providing proper integrated circuit chip initialization. Thus, slow transitions, appearing as indeterminate states on chip logic inputs which could cause oscillations on logic and buffer outputs, are eliminated.

As further seen in FIG. 4 of the drawings, for a particular desired application, the output voltage of the buffer circuit B1 is inverted through the third inverter I2. This arrangement provides a CLEAR output signal that remains substantially equal to ground potential and transitions once to the full voltage of Vdd when the power supply reaches a given level as determined by the hereinabove described power on detect circuit of the present invention. The CLEAR signal is often applied to an enable logic terminal located on the integrated circuit chip.

The CLEAR signal is also applied to a single shot amplifier which includes the first delay circuit D1, the fourth and fifth inverters I3 and I4, respectively, and the NAND circuit N, with the output of the amplifying inverter I4 being connected to the logic signal terminal SET. This arrangement results in the SET signal transitioning to a high level in response to the delayed CLEAR signal through the delay circuit D1. The duration of the SET signal in a high state is determined by the delay circuit D2, whereupon the SET output transitions back to ground. The SET signal is applied to, e.g., circuits for the loading of information contained in redundancy fuses into storage means such as a latch.

The circuit illustrated in FIG. 4 of the drawings has been simulated for a wide range of environmental as well as process parametric variations including hot plugging. It has also been verified in hardware.

Table 1 shows simulation results of the Vdd detect level.

2.9 volts $\leq$ Vdd $\leq$ 3.7 volts, and 50 ns $\leq$ $T_{ramp}$ $\leq$ 200 ms

TABLE 1

| Temp (°C.) | Process | Vdd Detect (Volts) |
|---|---|---|
| 0 | Best case | 1.75 |
| 85 | Nominal | 2.10 |
| 85 | Worst case | 2.40 |
| 140 | Best case | 1.65 |

The best case (fastest) process parametrics include the shortest length 1, the lowest threshold voltage $V_{th}$ and the highest transconductance of the transistors, the nominal process parametrics include all process parameters at nominal values of the transistors and the worst case (slowest) process parametrics include the longest length 1, the highest threshold voltage $V_{th}$ and the lowest transconductance of the transistors.

Figure 5:
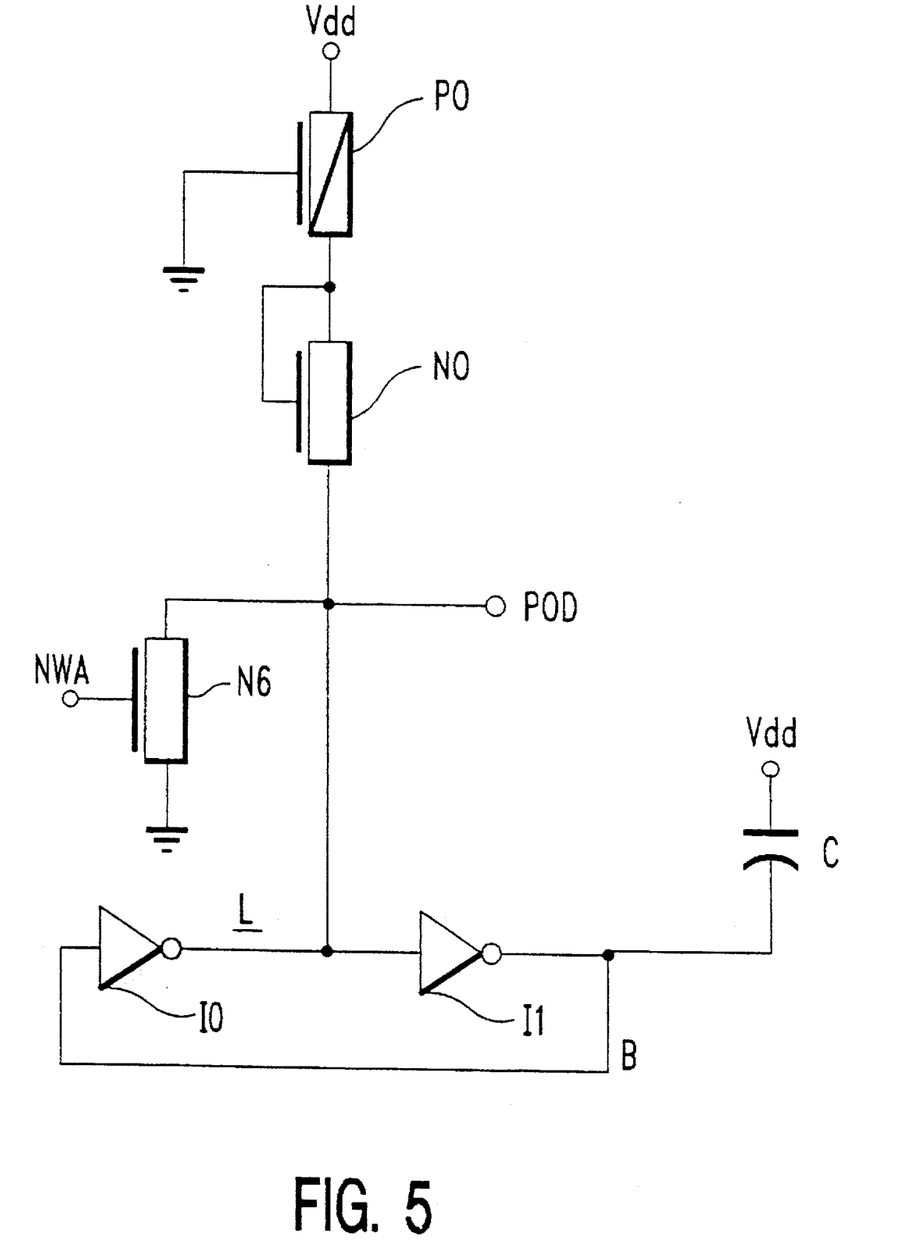
FIG. 5 is a circuit diagram of a further embodiment of the invention.

As indicated hereinabove, the power up detection circuit shown in FIG. 1 of the drawings functions reliably in any unregulated voltage environment, i.e., wherein an external power supply Vcc matches or is the same as the internal voltage Vdd of an integrated circuit chip. However, in situations where on-chip regulators are used modifications or additions to the power up detection circuit may be required to ensure reliable operation. Some on-chip voltage regulators are designed so that when the external power supply Vcc is ramped down to 0 volts, the internal voltage Vdd follows the external power supply Vcc down to a threshold potential above ground and then bleeds down to ground. If the external power supply Vcc is ramped up again before the internal voltage Vdd is less than 0.2 volts, the voltage at the output terminal POD in the power up detection circuit will not be regenerated again unless some modifications or additions are made to the detection circuit. An example of a modification or addition to the detection circuit is illustrated in FIG. 5 of the drawings wherein the same reference characters refer to similar elements shown in FIG. 1. It can be seen that the circuit of FIG. 5, is similar to that of FIG. 1 except that a bleeder device, shown as an N-channel field effect transistor N6 connected between the output terminal POD and the point of reference potential, is added to the circuit. The N-channel transistor N6 has a gate electrode connected to a terminal NWA which is the output terminal of a pumped internal chip net that may, e.g., be an on-chip N-well pump. As is known, when the external power supply Vcc is ramped down, the voltage at the terminal NWA will provide a high enough voltage to turn on the bleeder transistor N6 to rapidly discharge the output terminal POD to ground. Designed with heavy on-chip decoupling the terminal NWA is always greater than the internal voltage Vdd and is decoupled from the Vdd terminal when the external power supply Vcc is ramped down to zero volts. The bleeder transistor N6 is sized, e.g., with a width/length ratio of 1/160, so as to insure that node POD is brought down to ground to follow the external power supply Vcc within the time period the external power supply Vcc may cycle between Vcc and ground in any given application. The transistor N6 is a high impedance device which does not adversely affect the detection circuit in normal operation. Thus, it can be seen that provision must be made for any lack of linear tracking between the voltages Vcc and Vdd in regulated environments, either, e.g., by making slight circuit modifications or restricting hot plugging to periods greater than about one second.

Accordingly, it can be seen that an improved automatic power up detection circuit for integrated circuits, in either unregulated or regulated voltage environments, has been taught which utilizes subthreshold currents to provide for reliable detection of sufficient on chip voltage during power supply ramp up, with hardware and simulation results showing that this circuit operates reliably for a wide range of voltage, temperature, process and ramp rate variations.

While the invention has been particularly shown and described with reference to preferred embodiments thereof, it will be understood by those skilled in the art that various changes in form and detail may be made therein without departing from the spirit and scope of the invention.

What is claimed is:

1. A power up detection circuit comprising power supply terminal an output terminal, an impedance including a P-channel field effect transistor and an N-channel field effect transistor serially connected with said P-channel field effect transistor connecting said power supply terminal to said output terminal, and a latch having an input, said output terminal being coupled to the input of said latch.

2. A power up detection circuit as set forth in claim 1 wherein said N-channel field effect transistor is connect as a diode and said P-channel transistor has a gate electrode connected to a point of reference potential.

3. A power up detection circuit as set forth in claim 1 further including a capacitor connected between said power supply terminal and a second input of said latch.

4. A power up detection circuit comprising a power supply terminal, an output terminal, a voltage dependent current source connecting said power supply terminal to said output terminal, and a latch having an inputs, said output terminal being coupled the input of said latch.

5. A power up detection circuit as set forth in claim 4 further including a capacitor connected between said power supply terminal and a second input of said latch.

6. A power up detection circuit as set forth in claim 4 wherein said voltage dependent current source includes a field effect transistor.

7. A power up detection circuit as set forth in claim 4 further including a transistor connected between said output terminal and said point of reference potential and a pumped internal chip net terminal, said transistor having a gate electrode connected to said pumped internal chip net terminal.

8. A power up detection circuit as set forth in claim 4 wherein said latch includes first and second inverters, said first inverter having an output connected to an input of said second inverter, said output terminal being connected to the input of said second inverter.

9. A power up detection circuit as set forth in claim 8 further including a capacitor, said capacitor being connected between said power supply terminal and an input of said first inverter.

10. A power up detection circuit as set forth in claim 8 wherein said first inverter includes a first P-channel field effect transistor and a first N-channel field effect transistor and said second inverter includes a second P-channel field effect transistor and a second N-channel field effect transistor.

11. A power up detection circuit as set forth in claim 10 wherein said first P-channel transistor and said first N-channel transistor are serially connected between said power supply terminal and a point of reference potential and drain electrodes thereof are connected to a common point and said second P-channel transistor and said second N-channel transistor are serially connected between said power supply terminal and said point of reference potential and gate electrodes thereof and said output terminal are connected to said common point.

12. A power up detection circuit comprising power supply terminal, an output terminal, transistor means connecting said power supply terminal to said output terminal, and latch means including a first inverter, having a first transistor connected between said output terminal and a point of reference potential and a second transistor connected between said output terminal and said power supply terminal, and a second inverter, having third and fourth transistors serially connected between said power supply terminal and said point of reference potential, said first and second transistors being so designed that subthreshold current passing through said first transistor is greater than subthreshold current passing through said second transistor and subthreshold current passing through said third transistor is greater than subthreshold current passing through said fourth transistor.

13. A power up detection circuit as set forth in claim 12 wherein said fourth transistor is disposed between said third transistor and said point of reference potential.

14. A power up detection circuit as set forth in claim 13 wherein said second and third transistors are P-channel field effect transistors and said first and fourth transistors are N-channel field effect transistors.

15. A power up detection circuit as set forth in claim 14 further including a capacitor coupling said power supply terminal to an input node of said latch.

16. A power up detection circuit as set forth in claim 14 wherein said transistor means includes serially connected transistors.

17. A power up detection circuit as set forth in claim 16 wherein said serially connected transistors have a common point and include a P-channel field effect transistor having a gate electrode connected to said point of reference potential and an N-channel field effect transistor having a gate electrode connected to the common point.

18. A power supply detection circuit as set forth in claim 14 further including a Schmitt trigger circuit coupled to said output terminal.

19. A power up detection circuit as set forth in claim 18 further including a CLEAR terminal, the output of said Schmitt trigger circuit being coupled to said CLEAR terminal through a buffer circuit and a third inverter and a single shot amplifier circuit having an input connected to said CLEAR terminal and an output connected to a SET terminal.

20. A power up detection circuit as set forth in claim 19 wherein said single shot amplifier circuit includes first and second delay circuits, a NAND circuit and fourth and fifth inverters, an output of said first delay circuit being connected to an input of said second delay circuit and to a first input of said NAND circuit, an output of said second delay circuit being coupled to a second input of said NAND circuit through said fourth inverter, and said NAND circuit having an output coupled to said SET terminal through said fifth inverter.

* * * * *